US007737634B2

(12) United States Patent
Leng et al.

(10) Patent No.: US 7,737,634 B2
(45) Date of Patent: Jun. 15, 2010

(54) LED DEVICES HAVING IMPROVED CONTAINMENT FOR LIQUID ENCAPSULANT

(75) Inventors: Margaret Tan Kheng Leng, Bukit Jambul (MY); Janet Bee Yin Chua, Jalan Bruas (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 526 days.

(21) Appl. No.: 11/369,612

(22) Filed: Mar. 6, 2006

(65) Prior Publication Data

US 2007/0216297 A1    Sep. 20, 2007

(51) Int. Cl.
*H01J 1/62* (2006.01)
(52) U.S. Cl. .................. 313/512; 257/99; 257/100; 313/110
(58) Field of Classification Search .......... 257/98–100; 313/501–512, 110; 445/24, 25
See application file for complete search history.

(56) References Cited

U.S. PATENT DOCUMENTS 7,105,863 B1 * 9/2006 Ng et al. .................. 257/99

| 7,329,907 B2 * | 2/2008 | Pang et al. ............ 257/99 |
| 2002/0057057 A1 * | 5/2002 | Sorg ................ 313/512 |
| 2004/0079957 A1 * | 4/2004 | Andrews et al. ........ 257/100 |
| 2005/0029929 A1 | 2/2005 | Debray |
| 2005/0134164 A1 * | 6/2005 | Auerbach et al. ........ 313/474 |

FOREIGN PATENT DOCUMENTS

| WO | WO97/50132 | 12/1997 |
| WO | WO98/05078 | 2/1998 |
| WO | WO98/12757 | 3/1998 |

* cited by examiner

*Primary Examiner*—Nimeshkumar D Patel
*Assistant Examiner*—Mary Ellen Bowman

(57) ABSTRACT

A light emitting diode ("LED") Device with Flexible Containment for Liquid Encapsulant is disclosed. The LED Device with Flexible Containment for Liquid Encapsulant includes an LED in a concave base housing, the LED having a p-doped semiconductor body and an n-doped semiconductor body. The device further includes a liquid containment chamber over the LED, configured to contain liquid encapsulant, and space permitting expansion and contraction of the liquid encapsulant in the chamber.

13 Claims, 8 Drawing Sheets

LED DEVICES HAVING IMPROVED CONTAINMENT FOR LIQUID ENCAPSULANT

BACKGROUND OF THE INVENTION

Light emitting diode ("LED") devices are useful for generating light output. LED devices may convert electricity into photonic emissions more efficiently than incandescent and fluorescent bulbs. There accordingly are potentially great benefits, including energy conservation benefits, to LED utilization for lighting and other photonic applications. Further, as solid state devices, LEDs may have a larger average lifetime of utilization than and often are more resistant to physical damage than are conventional incandescent and fluorescent bulbs.

An LED may be positioned in a concave base housing and provided with anode and cathode bonding wires, placing the LED in communication with an electrical circuit for supplying a bias voltage to the LED. The LED may then be encapsulated in a material suitable to protect the LED from external contaminants and from being physically damaged or dislodged, and to form part of a lens system for focusing the light output of the LED. As an example, epoxy resin is often selected as the encapsulant, due to its useful material properties including hardness, resistance to chemicals, good adhesion to diverse materials, and good optical properties. The epoxy resin may be applied in the form of a liquid casting or molding composition. After the epoxy resin composition cures to form a solid polymer encapsulant, the LED device may be connected to an external circuit, and a bias voltage may be applied to the LED to generate light. The light generated by such an LED device may be intense, and substantial heat may also be generated. Extended exposure of the epoxy polymer resin encapsulant to light emitted by the LED, such as ultraviolet light, may cause molecular degradation of the epoxy polymer resin. Thermal cycling of the LED device as it is repeatedly activated to generate light and then allowed to cool may also cause heat degradation of the epoxy polymer resin encapsulant. Heat degradation may include further molecular degradation of the epoxy polymer resin, as well as mechanical degradation of the LED device itself due to repeated expansion and contraction of the encapsulant body having an embedded LED and bonding wires, since the encapsulant body may be juxtaposed with a concave base housing and other device elements that may have very different coefficients of thermal expansion.

In an effort to overcome the drawbacks of a permanent, solid epoxy polymer resin encapsulant, LED devices have been made using a liquid encapsulant housed in a suitable containment element. As an example, silicone liquids and silicone oils have been so used. However, these silicone encapsulants may have high coefficients of thermal expansion. Repeated heat cycling of the LED device accordingly may generate corresponding cycles of expansion and contraction of the liquid encapsulant. These cycles may in turn cause expansion and contraction of the containment element. The consequent stress applied to the other elements of the LED device, such as a concave base housing, may cause cracking and eventual failure of elements of the LED device, including the containment and base housing elements.

Therefore, as LED devices are implemented for diverse end use applications, there is a continuing need to provide LED device structures permitting the use of liquid encapsulants and having improved containment for such encapsulants.

SUMMARY

An LED Device with Flexible Containment for a Liquid Encapsulant ("LED Device with Flexible Containment for Liquid Encapsulant") is described. In an example of an implementation, the LED Device with Flexible Containment for Liquid Encapsulant may include a light emitting diode ("LED") in a concave base housing, the LED having a p-doped semiconductor body and an n-doped semiconductor body. The LED device may further include a liquid containment chamber over the LED, configured to contain a liquid encapsulant. The LED device may additionally include space permitting expansion and contraction of the liquid encapsulant in the chamber. As an example, the LED device may include a conduit, configured to contain liquid encapsulant, in communication with the liquid containment chamber. In an example, a reservoir may communicate with the conduit. As another example, the LED device may include a groove, configured to contain liquid encapsulant, in communication with the liquid containment chamber.

As an example, a method is provided for fabricating an LED Device with Flexible Containment for Liquid Encapsulant, the method including: forming a concave base housing and placing an LED in the concave base housing, the LED having a p-doped semiconductor body and an n-doped semiconductor body. A liquid containment chamber may be formed over the LED, configured to contain a liquid encapsulant. Space may be formed permitting expansion and contraction of the liquid encapsulant in the chamber. As an example, a conduit, configured to contain liquid encapsulant, may be formed in communication with the liquid containment chamber. In an implementation, the conduit may be placed in communication with a region outside of the device. As another example, a reservoir may be formed in communication with the conduit. In a further implementation, a groove, configured to contain liquid encapsulant, may be formed in communication with the liquid containment chamber.

Other systems, methods and features of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood with reference to the following figures. The components in the figures are not necessarily to scale, emphasis instead being placed upon illustrating the principles of the invention. In the figures, like reference numerals designate corresponding parts throughout the different views.

DETAILED DESCRIPTION

In the following description of various implementations, reference is made to the accompanying drawings that form a part of this disclosure, and which show, by way of illustration, specific implementations in which the invention may be practiced. Other implementations may be utilized and structural changes may be made without departing from the scope of the present invention.

Figure 1:
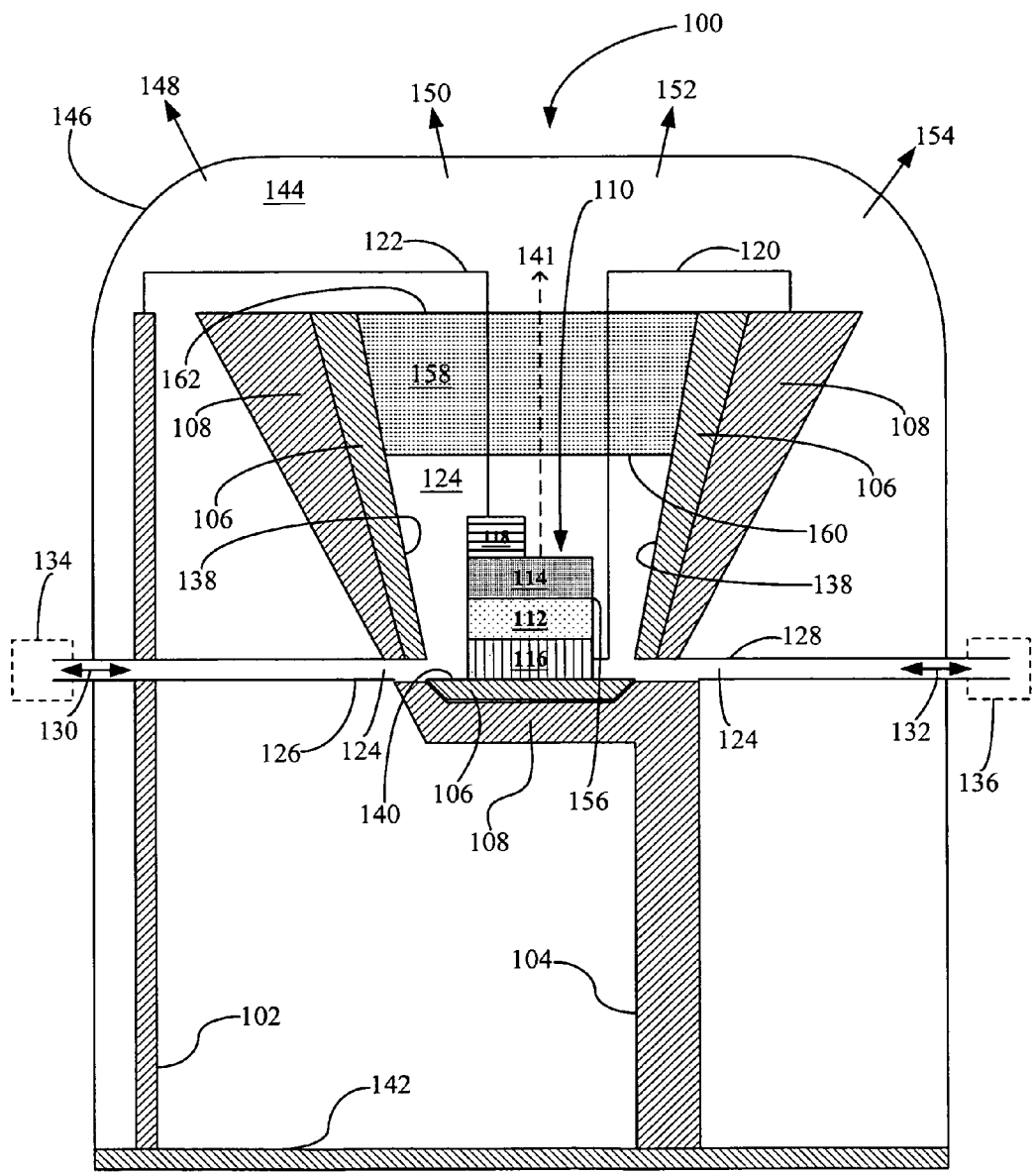
FIG. 1 is a cross-sectional view showing an example of an LED Device with Flexible Containment for Liquid Encapsulant.

FIG. 1 shows a cross-sectional view of an example of an LED Device with Flexible Containment for Liquid Encapsulant 100. The LED Device with Flexible Containment for Liquid Encapsulant 100 may include an anode 102 and a cathode 104. The cathode 104 may include a concave (e.g., bowl shaped, cup-shaped, or bowl and cup shaped) base housing 106 formed of an electrical insulator. The concave base housing 106 may be supported on a frame 108. An LED 110 may be placed in the concave base housing 106. The frame 108 may be integrated with the cathode 104, and may be fabricated, for example, from lead. It is appreciated by those skilled in the art that the frame 108 may alternatively be any form of printed circuit board, such as, for example, one fabricated of FR4, FR5, bismaleimide/triazine (BT), polyimide, or metal core. It is also appreciated that the frame 108 may instead be in another form, such as for example a metal coated ceramic frame, a plastic substrate, or a lead frame with a plastic body or cavity. The LED 110 may include a p-doped semiconductor body 112 and an n-doped semiconductor body 114. It is appreciated by those skilled in the art that the term "body" as used throughout this specification broadly means and includes all forms of a mass of a subject device element, such as, for example, a layer, multiple layers, a coating, a casting, or a block, of any suitable dimensions, however formed. As an example, the shape of the LED 110 may be a rectangular prism. In other examples, the shape of the LED 110 may be cubic, cylindrical, or have another selected geometric shape. As an example, more than one LED 110 may be placed in the concave base housing 106.

The p-doped semiconductor body 112 may be in signal communication with a base conductor 116 and the n-doped semiconductor body 114 may be in signal communication with a top conductor 118. The base conductor 116 and top conductor 118 may allow current to flow in and out of the p-doped semiconductor body 112 and n-doped semiconductor body 114, respectively. A cathode bonding wire 120 may electrically connect the cathode 104 to the base conductor 116, placing the cathode 104 in signal communication with the base conductor 116. Similarly, an anode bonding wire 122 may electrically connect the anode 102 to the top conductor 118. As an example, more than one cathode bonding wire 120 or more than one anode bonding wire 122, or more than one of each of such wires, may be utilized. In an alternative example (not shown), the concave base housing 106 may be formed of an electrical conductor, and the base conductor 116 and the cathode bonding wire 120 may be omitted.

It is appreciated that in a further alternative example structure for the LED Device with Flexible Containment for Liquid Encapsulant, the semiconductor body 114 may be p-doped and the semiconductor body 112 may be n-doped. A current flow through the LED 110 in such an alternative structure may be reversed, so that the LED Device with Flexible Containment for Liquid Encapsulant 100 may include an anode 104 and a cathode 102. As another example, the cathode 104 may be replaced by a first terminal 104 at a relatively high electrical potential in signal communication with the p-doped semiconductor body 112; and the anode 102 may be replaced by a second terminal 102 at a relatively low electrical potential in signal communication with the n-doped semiconductor body 114.

As an example, the LED 110 may be immersed in a liquid encapsulant composition that is contained in a liquid containment chamber 124. The liquid containment chamber 124 may include and be in fluid communication with conduits 126 and 128 that may communicate with regions located exterior to the LED device 100, as indicated by arrows 130 and 132, respectively. The liquid encapsulant composition may be, as an example, generally confined in a stationary manner in the liquid containment chamber 124. Movement of liquid encapsulant into and out of the conduits 126 and 128 may then occur as the liquid encapsulant expands and contracts during heating and cooling cycles in operation of the LED device 100. More than one input conduit and more than one output conduit may be provided. As a further example, the conduits 126 and 128 may communicate with reservoirs for the liquid encapsulant composition schematically indicated by dotted lines 134 and 136. As the liquid encapsulant composition in the liquid containment chamber 124 expands and contracts, excess liquid encapsulant may flow into and out of the reservoirs 134 and 136 via the conduits 126 and 128. The conduits 126 and 128, or the reservoirs 134 and 136, or any combination of the conduits and reservoirs 126, 128, 134 and 136 may, as another example, contain a porous material configured to reversibly absorb the liquid encapsulant composition.

The liquid encapsulant composition may generally be any liquid composition having good optical properties. Throughout this specification, the term "good optical properties" means that the selected encapsulant composition may allow much of the visible light generated by the LED to escape from the LED device, and to thus absorb a minimal portion of the light generated by the LED. As an example, such a liquid encapsulant composition may be selected that has a viscosity suitable to permit the encapsulant composition to easily flow in and out of the conduits 126 and 128 without clogging or excessive capillary surface resistance and, if included, to similarly flow in and out of the reservoirs 134 and 136. Silicone liquid and silicone oil compositions recognized for use as LED encapsulants, as an example, may be utilized.

The inner walls (such as side inner wall 138 and base inner wall 140) of the concave base housing 106 may form a reflector for the photons emitted by the LED 110. The reflector may deflect photons generally in a direction 141 of maximum photonic radiation from the LED Device with Flexible Containment for Liquid Encapsulant 100. As an example, the base inner wall 140 may have a circular circumference and the side inner wall 138 may also have a circular circumference. It is appreciated, however, that the base inner wall 140 and the side inner wall 138 may also have circumferences of other shapes. For example, the base inner wall 140 may have a circumference that is elliptical, quadrilateral, or of some other geometric shape. The circumference of the base inner wall 140 may as an example have at least one axis of symmetry. In an implementation, the shape of the circumference of the side inner wall 138 may be similar to that of the base inner wall 140. In an implementation, the circumference of the side inner wall 138 may generally increase in the direction of the arrow 141.

The anode 102 and cathode 104 of the LED Device with Flexible Containment for Liquid Encapsulant 100 may be supported on a base 142, and collectively encapsulated in a diffused lens 144 that may have an encapsulation domed surface 146 forming a substantially convex lens for example photonic emissions 148, 150, 152 and 154 from the LED Device with Flexible Containment for Liquid Encapsulant 100. In another implementation, the lens 144 may not be a diffused lens.

In an example of operation, a bias current may be applied across the anode 102 and cathode 104 by an external power source, not shown. The bias current may induce charge carriers to be transported across the interface 156 between the n-doped semiconductor body 114 and the p-doped semiconductor body 112. Electrons flow from the n-doped semiconductor body 114 to the p-doped semiconductor body 112, and holes are generated in the opposite direction. Electrons injected into the p-doped semiconductor body 112 recombine with the holes, resulting in electroluminescent emission of photons from the LED 110.

As a further example, the LED Device with Flexible Containment for Liquid Encapsulant 100 may be a phosphor-converting LED device having a phosphor element 158 including a selected phosphor. The selected phosphor may as an example be dispersed in a suitable encapsulant in a liquid phase and then deposited onto an upper wall of the liquid containment chamber 124 to form the phosphor element 158. The phosphor element 158 may then form an interface 160 with the liquid containment chamber 124, and an interface 162 with the diffused lens 144.

In an example of operation, electroluminescent emissions from the LED 110 itself at one wavelength may be partially intercepted by the phosphor, resulting in stimulated luminescent emissions from the phosphor that may be at a longer wavelength than that of the electroluminescent emissions. Photons emitted by the LED 110 at a first wavelength and by the phosphor at a second wavelength may then be additively emitted from the LED Device with Flexible Containment for Liquid Encapsulant 100. It is appreciated by those skilled in the art that the LED as an example may be designed to emit blue photons, and the phosphor may be designed to emit yellow photons, in ratios where the additive output may be perceived by the human eye as white light.

As an example, the LED 110 may be designed to emit blue light, where photonic emissions interpreted by the human eye as white light are needed. Gallium nitride- ("GaN-") or indium-gallium-nitride ("InGaN-") based LED semiconductor chips emitting blue light with an emission maximum broadly within a range of about 420 nanometers ("nm") to about 490 nm, or more particularly within a range of about 430 nm to about 480 nm, may be utilized. The term "GaN- or InGaN-based LED" is to be understood as being an LED whose radiation-emitting region contains GaN, InGaN, or either or both of such nitrides together with other related nitrides, as well as compositions further including mixed crystals based on such nitrides, such as Ga(Al—In)N, for example. Such LEDs are known, for example, from Shuji Nakamura and Gerhard Fasol, "The Blue Laser Diode", Springer Verlag, Berlin/Heidelberg, 1997, pp. 209 et seq., the entirety of which hereby is incorporated herein by reference. In another example, a polymer LED or a laser diode may be utilized instead of the semiconductor LED. It is appreciated that the term "light emitting diode" is defined as encompassing and including as examples, semiconductor light emitting diodes, polymer light emitting diodes, and laser diodes.

The choice of phosphors for excitation by some of the blue photons emitted by the LED also may be determined by the selected end use application for the LED Device with Flexible Containment for Liquid Encapsulant 100. As an example, the selected phosphor may be designed to emit yellow light where photonic emissions interpreted by the human eye as white light are needed. When combined in appropriate ratios at appropriate wavelengths as shown, for example, in chromaticity charts published by the International Commission for Illumination, the blue and yellow photons appear together to the eye as white light. In this regard, yttrium aluminum garnet ("YAG") is a common host material, and may be doped with one or more rare-earth elements or compounds. Cerium is a common rare-earth dopant in YAG phosphors utilized for white light emission applications.

As an example, the selected phosphor may be a cerium-doped yttrium-aluminum garnet including at least one element such as yttrium, lutetium, selenium, lanthanum, gadolinium, samarium, or terbium. The cerium-doped yttrium-aluminum garnet may also include at least one element such as aluminum, gallium, or indium. As an example, the selected phosphor may have a cerium-doped garnet structure $A_3B_5O_{12}$, where the first component "A" represents at least one element such as yttrium ("Y"), lutetium ("Lu"), selenium ("Se"), lanthanum ("La"), gadolinium ("Gd"), samarium ("Sm"), or terbium ("Tb") and the second component "B" represents at least one element such as aluminum ("Al"), gallium ("Ga"), or indium ("In"). These phosphors may be excited by blue light from the LED 110 and in turn may emit light whose wavelength is shifted into the range above 500 nm, ranging up to about 585 nm. As an example, a phosphor may be utilized having a wavelength of maximum emission that is within a range of about 550 nm to about 585 nm. In the case of cerium-activated Tb-garnet luminescent materials, the emission maximum may be at about 550 nm. Relatively small amounts of Tb in the host lattice may serve the purpose of improving the properties of cerium-activated luminescent materials, while larger amounts of Tb may be added specifically to shift the emission wavelength of cerium-activated luminescent materials. A high proportion of Tb is therefore well suited for white phosphor-converted LED devices with a low color temperature of less than 5000 K. For further background information on phosphors for use in phosphor-converted LED devices, see for example: published Patent Cooperation Treaty documents WO 98/05088; WO 97/50132; WO 98/12757; and WO 97/50132, which are herein incorporated by reference in their entirety.

As an example, a blue-emitting LED based on gallium nitride or indium-gallium nitride, with emission maxima within a range of about 430 nm to about 480 nm, may be utilized to excite a luminescent material of the YAG:Ce type with emission maxima within a range of about 526 nm to about 585 nm.

Various examples have been described above of implementations where an LED Device with Flexible Containment for Liquid Encapsulant is designed to combine blue photons generated by electroluminescence emitted by LED 110 with yellow photons generated from blue photon-stimulated luminescence of a phosphor element 158, in order to provide light output having a white appearance. However, it is appreciated that LED Devices with Flexible Containment for Liquid Encapsulants operating with different chromatic schemes may also be designed for producing light that appears to be white or appears to have another color. Light that appears to be white may be realized through many combinations of two or more colors generated by LED 110 electroluminescence and photon-stimulated phosphor luminescence. One example method for generation of light having a white appearance is to combine light of two complementary colors in the proper power ratio.

With regard to the LED 110 itself, photon-emitting diode p-n junctions are often based on two selected mixtures of Group III and Group V elements, such as gallium arsenide, gallium arsenide phosphide, or gallium phosphide. Careful control of the relative proportions of these compounds, and others incorporating aluminum and indium, as well as the addition of dopants such as tellurium and magnesium, may enable production of LEDs that emit, for example, red, orange, yellow, or green light. As an example, the following semiconductor compositions may be utilized to generate photons in the indicated spectral ranges: gallium-aluminum-arsenide/gallium arsenide (epitaxial layers/LED substrate) (output wavelength 880 nm, infrared); gallium-aluminum-arsenide/gallium-aluminum-arsenide (660 nm, ultra red); aluminum-gallium-indium-phosphide (633 nm, super red); aluminum-gallium-indium-phosphide (612 nm, super orange); gallium-arsenide/gallium-phosphide (605 nm, orange); gallium-arsenide-phosphide/gallium-phosphide (585 nm, yellow); indium-gallium-nitride/silicon-carbide (color temperature 4500K, incandescent white); indium-gallium-nitride/silicon-carbide (6500K, pale white); indium-gallium-nitride/silicon-carbide (8000K, cool white); gallium-phosphide/gallium-phosphide (555 nm, pure green); gallium-nitride/silicon-carbide (470 nm, super blue); gallium-nitride/silicon-carbide (430 nm, blue violet); and indium-gallium-nitride/silicon-carbide (395 nm, ultraviolet). It is understood that two selected mixtures of Group II and Group VI elements or a mixture of Group IV elements may alternatively be utilized.

As an example, a phosphor selected as discussed above may be dispersed in an encapsulant, forming a phosphor-encapsulant composition for deposition onto an upper wall of and forming an interface 160 with the liquid containment chamber 124. The encapsulant is at least partially transparent to the generated photonic radiation. As an example, the encapsulant may be a curable polymeric resin, such as an epoxy, silicone or acrylate resin (such as polymethyl-methacrylate for example), or a mixture of such resins. As an example, the encapsulant may be another photonic radiation-transmissive material, such as an inorganic glass that may be in the form of a sol-gel, for example. It is appreciated that the phosphor element 158 may be omitted. As an example, where the phosphor element 158 is omitted, the liquid containment chamber 124 may extend to and define the interface 162.

Figure 2:
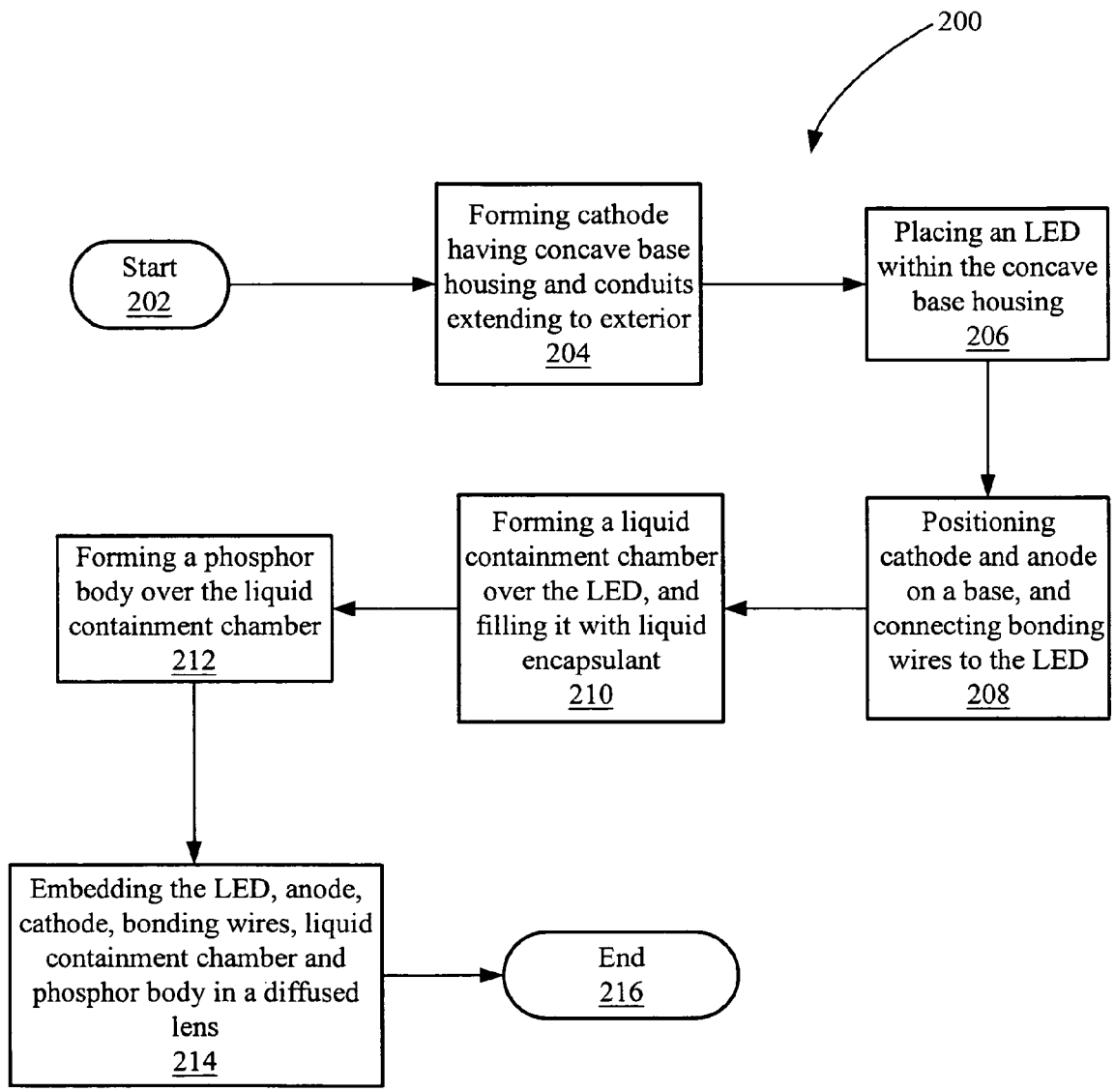
FIG. 2 is a flowchart showing an example of a method for fabricating the LED Device with Flexible Containment for Liquid Encapsulant shown in FIG. 1.

FIG. 2 is a flowchart 200 showing an example of a process for fabricating the LED Device with Flexible Containment for Liquid Encapsulant 100 shown in FIG. 1. The process starts in step 202, and in step 204, a cathode 104 having a concave base housing 106 may be formed, in which the concave base housing 106 may be supported by a frame 108 and may have photon-reflective side inner wall 138 and base inner wall 140. Conduits 126 and 128 may be provided, which may pass through the concave base housing 106 and the frame 108. The conduits 126 and 128 may communicate with reservoirs 134 and 136 formed exterior from the LED Device with Flexible Containment for Liquid Encapsulant 100.

An LED 110 may be placed in the concave base housing 106 on the base inner wall 140, in step 206. The LED 110 may be pre-made, or formed in situ. The LED 110 may be positioned at a point on the base inner wall 140 substantially equidistant from all points at which base inner wall 140 meets side inner wall 138. The LED 110 may be fabricated using various known techniques such as, for example, liquid phase epitaxy, vapor phase epitaxy, metal-organic epitaxial chemical vapor deposition, or molecular beam epitaxy. In step 208, the cathode 104 and an anode 102 may be positioned on a base 142, and bonding wires 120 and 122 may be connected to the conductors 116 and 118 and to the cathode 104 and anode 102, respectively.

In step 210, an upper wall defining a liquid containment chamber 124 may be formed at the interface 160. The liquid containment chamber 124 may be in communication and integral with the conduits 126 and 128. The liquid containment chamber 124 may be filled with a suitable liquid encapsulant composition. In step 212, a phosphor-encapsulant composition may be formulated as discussed above, and a phosphor body 158 may be formed in the concave base housing 106 and may be interfaced with the upper wall of the liquid containment chamber 124. As an example, the phosphor body 158 may be molded or cast into the selected shape. It is appreciated that step 212 may be omitted, in which case the upper wall of the liquid containment chamber 124 may be formed at the interface 162.

In step 214, the LED 110, anode 102, cathode 104, bonding wires 120 and 122, liquid containment chamber 124, and if present, the phosphor body 158, may be embedded in a diffused lens 144. The process then ends in step 216. The diffused lens may be fabricated from an encapsulant as discussed earlier, having dispersed light-scattering particles such as metal oxide particles. As examples, titanium dioxide or silicon dioxide particles may be utilized. Additionally, the diffused lens 144 may be formed with the selected dome shape, for example, by molding or casting. It is appreciated that the order of steps in the process 200 may be changed. As an example, either all or a portion of step 208 may be performed later in the process without departing from the method.

Figure 3:
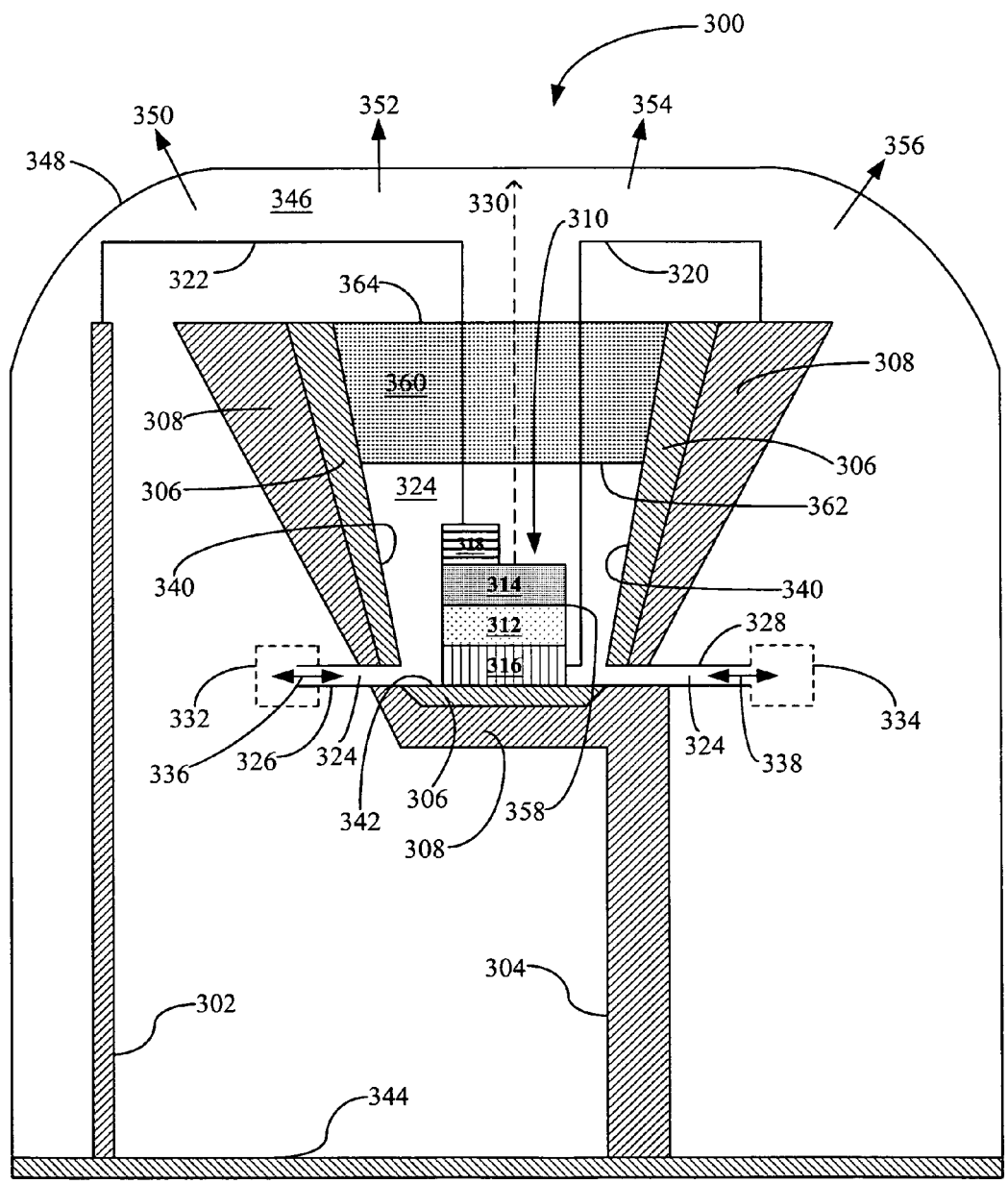
FIG. 3 is a cross-sectional view showing an example of another LED Device with Flexible Containment for Liquid Encapsulant.

FIG. 3 is a cross-sectional view showing an example of another LED Device with Flexible Containment for Liquid Encapsulant 300. The LED Device with Flexible Containment for Liquid Encapsulant 300 may include an anode 302, and a cathode 304. Similar to FIG. 1, the cathode 304 may include a concave base housing 306 formed of an electrical insulator. The concave base housing 306 may be supported on a frame 308. An LED 310 may be placed in the concave base housing 306. The frame 308 may be integrated with the cathode 304, and may be fabricated, for example, from lead or another material as earlier discussed. The LED 310 may include a p-doped semiconductor body 312 and an n-doped semiconductor body 314. As an example, more than one LED 310 may be placed in the concave base housing 306.

The p-doped semiconductor body 312 may be in signal communication with a base conductor 316 and the n-doped semiconductor body 314 may be in signal communication with a top conductor 318. A cathode bonding wire 320 may electrically connect the cathode 304 to the base conductor 316 placing the cathode 304 in signal communication with the base conductor 316. An anode bonding wire 322 may electrically connect the anode 302 with the top conductor 318 placing the anode 302 in signal communication with the top conductor 318. As an example, more than one cathode bonding wire 320 or more than one anode bonding wire 322 or more than one of each such wires may be utilized. Similar to FIG. 1, the base conductor 316 and top conductor 318 may allow current to flow in and out of the p-doped semiconductor body 312 and n-doped semiconductor body 314, respectively. As an alternative example, the concave base housing 306 may be formed of an electrical conductor, and the base conductor 316 and the cathode bonding wire 320 may be omitted.

It is appreciated that in a further alternative example structure for the LED Device with Flexible Containment for Liquid Encapsulant, the semiconductor body 314 may be p-doped and the semiconductor body 312 may be n-doped. A current flow through the LED 310 in such an alternative structure may be reversed, so that the LED Device with Flexible Containment for Liquid Encapsulant 300 may include an anode 304 and a cathode 302. As another example, the cathode 304 may be replaced by a first terminal 304 at a relatively high electrical potential in signal communication with the p-doped semiconductor body 312; and the anode 302 may be replaced by a second terminal 302 at a relatively low electrical potential in signal communication with the n-doped semiconductor body 314.

As an example, the LED 310 may be immersed in a liquid encapsulant composition that is contained in a liquid containment chamber 324. The liquid containment chamber 324 may include and may be in fluid communication with conduits 326 and 328 that each may provide a defined expansion volume for the liquid encapsulant composition. Movement of liquid encapsulant into and out of the conduits 326 and 328 may occur as the liquid encapsulant expands and contracts during heating and cooling cycles in operation of the LED device 300. Further conduits similar to conduits 326 and 328 may be arranged around the central axis of the LED device 300, the axis being indicated by the arrow 330. As a further example, the conduits 326 and 328 may communicate with reservoirs for the liquid encapsulant composition schematically indicated by dotted lines 332 and 334. As the liquid encapsulant composition in the liquid containment chamber 324 expands and contracts, excess liquid encapsulant may flow into and out of the reservoirs indicated by dotted lines 332 and 334 via the conduits 326 and 328, in the directions of the arrows 336 and 338. The liquid encapsulant composition may generally be any liquid composition having good optical properties, as discussed earlier. The conduits 326 and 328 may, as an example, contain a porous material configured to reversibly absorb the liquid encapsulant composition.

The side inner wall 340 and base inner wall 342 of the concave base housing 306 may form a reflector for the photons emitted by the LED 310, and may deflect photons generally in the direction of the arrow 330 toward which maximum photonic radiation may be focused by the LED Device with Flexible Containment for Liquid Encapsulant 300. The side inner wall 340 may have a circular circumference. The anode 302 and cathode 304 of the LED Device with Flexible Containment for Liquid Encapsulant 300 may be supported on a base 344, and may be collectively encapsulated in a lens 346 that may be a diffused lens. The lens may have a domed surface 348 forming a substantially convex lens for example photonic emissions 350, 352, 354 and 356 from the LED Device with Flexible Containment for Liquid Encapsulant 300. In another example, the lens 346 may not be a diffused lens.

In an example of operation, a bias current may be applied across the anode 302 and cathode 304 by an external power source, not shown. The bias current may induce charge carriers to be transported across the interface 358 between the n-doped semiconductor body 314 and the p-doped semiconductor body 312. Electrons flow from the n-doped semiconductor body 314 to the p-doped semiconductor body 312, and holes are generated in the opposite direction. Electrons injected into the p-doped semiconductor body 312 recombine with the holes, resulting in electroluminescent emission of photons from the LED 310.

As a further example, the LED Device with Flexible Containment for Liquid Encapsulant 300 may be a phosphor-converting LED device having a phosphor element 360 including a selected phosphor. The selected phosphor may be dispersed in a suitable encapsulant in a liquid phase and then deposited onto an upper wall of the liquid containment chamber 324 to form the phosphor element 360. The phosphor element may then form an interface 362 with the liquid containment chamber 324, and an interface 364 with the diffused lens 346.

As an example, a phosphor may be dispersed in an encapsulant as discussed above, forming a phosphor-encapsulant composition for deposition onto an upper wall of and forming an interface 362 with the liquid containment chamber 324. It is appreciated that the phosphor element 360 may be omitted. As an example, where the phosphor element 360 is omitted, the liquid containment chamber 324 may extend to and define the interface 364.

Figure 4:
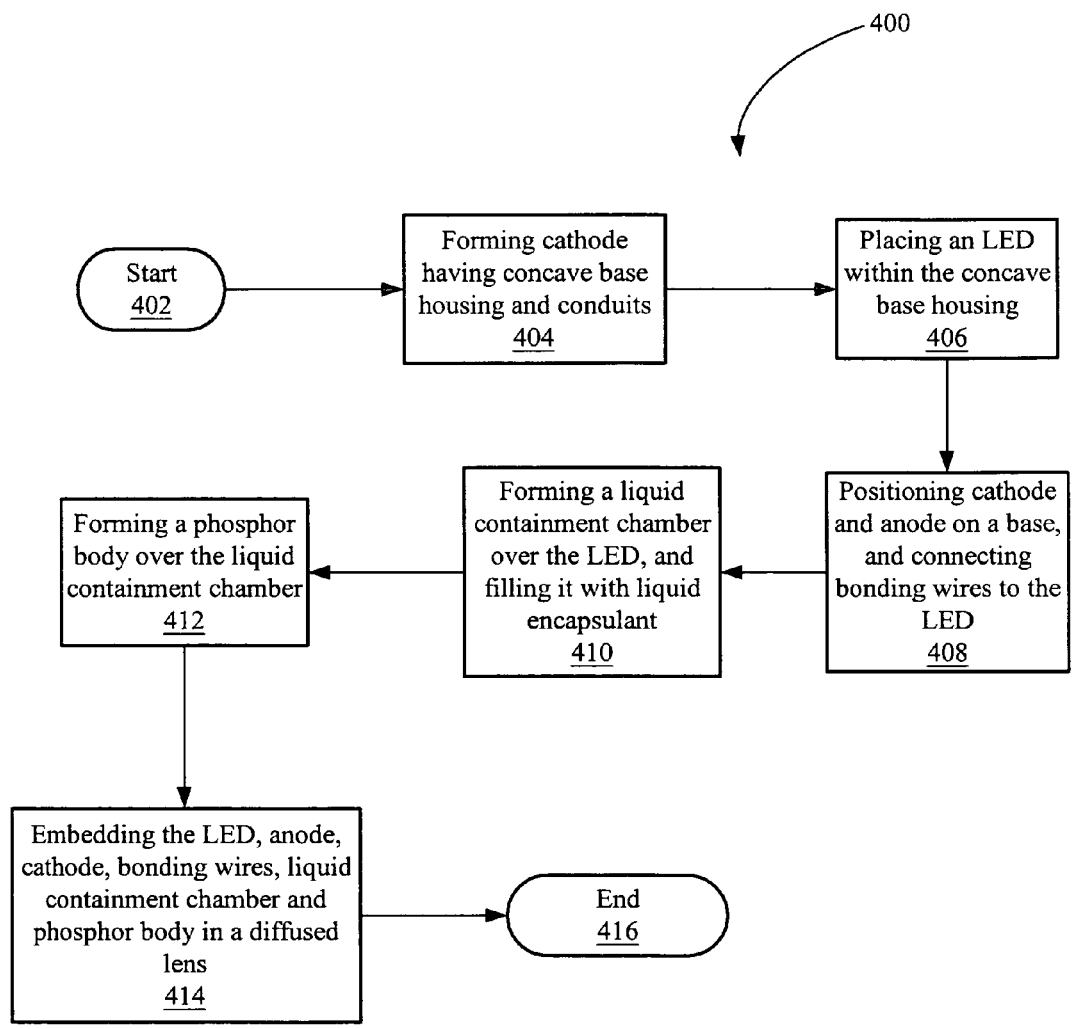
FIG. 4 is a flowchart showing an example of a method for fabricating the LED Device with Flexible Containment for Liquid Encapsulant shown in FIG. 3.

FIG. 4 is a flowchart 400 showing an example of a process for fabricating the LED Device with Flexible Containment for Liquid Encapsulant 300 shown in FIG. 3. The process begins in step 402, and in step 404, a cathode 304 having a concave base housing 306 may be formed, in which the concave base housing 306 may be supported by a frame 308 and may have photon-reflective side inner wall 340 and base inner wall 342. Conduits 326 and 328 may be provided, which may pass through the concave base housing 306 and the frame 308. The conduits 326 and 328 may communicate with reservoirs 332 and 334 formed in the LED Device with Flexible Containment for Liquid Encapsulant 300.

An LED 310 may be placed in the concave base housing 306 on the base inner wall 342, in step 406. The LED 310 may be pre-made, or formed in situ. The LED 310 may be positioned at a point on the base inner wall 342 substantially equidistant from all points at which base inner wall 342 meets side inner wall 340. The LED 310 may be fabricated as described above in the discussion of FIG. 2. In step 408, the cathode 304 and an anode 302 may be positioned on a base 344, and bonding wires 320 and 322 may be connected to the conductors 316 and 318 and to the cathode 304 and anode 302, respectively.

In step 410, an upper wall defining a liquid containment chamber 324 may be formed at the interface 362, the liquid containment chamber being in communication and integral with the conduits 326 and 328. The liquid containment chamber 324 may be filled with a suitable liquid encapsulant composition. In step 412, a phosphor-encapsulant composition may be formulated as discussed above, and a phosphor body 360 may be formed in the concave base housing 306. The phosphor body 360 may also be interfaced with the upper wall of the liquid containment chamber 324. As an example, the phosphor body 360 may be molded or cast into the selected shape. It is appreciated that step 412 may be omitted, in which case the upper wall of the liquid containment chamber 324 may be formed at the interface 364.

In step 414, the LED 310, anode 302, cathode 304, bonding wires 320 and 322, liquid containment chamber 324, and if present, the phosphor body 360, may be embedded in a diffused lens 346. The process then ends in step 416. The diffused lens may be fabricated as discussed above in connection with FIG. 2. It is appreciated that the order of steps in the process 400 may be changed. As an example, either all or a portion of step 408 may be performed later in the process without departing from the method.

Figure 5:
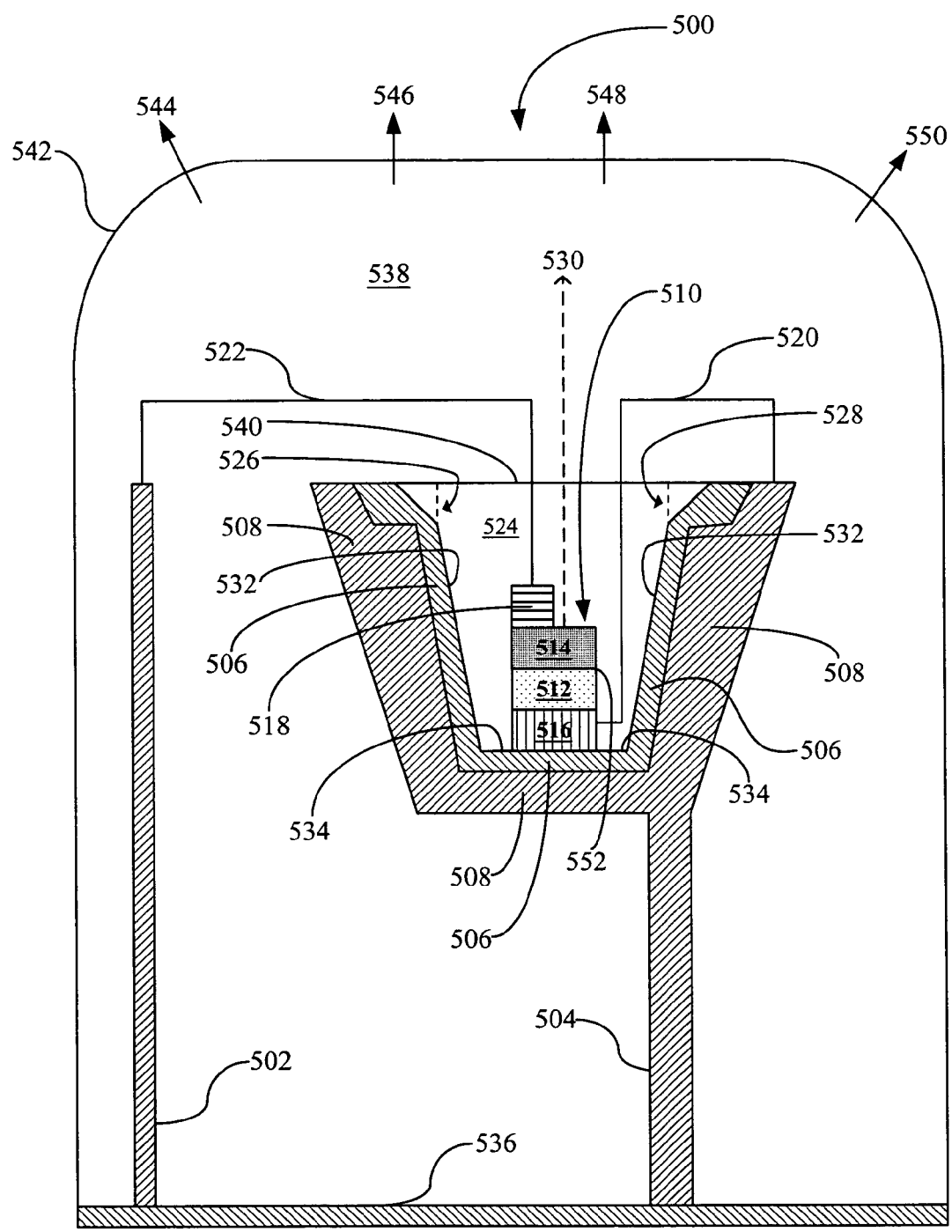
FIG. 5 is a cross-sectional view showing an example of yet another LED Device with Flexible Containment for Liquid Encapsulant.

FIG. 5 is a cross-sectional view showing an example of another LED Device with Flexible Containment for Liquid Encapsulant 500. The LED Device with Flexible Containment for Liquid Encapsulant 500 may include an anode 502, and a cathode 504. The cathode 504 may include a concave base housing 506 formed of an electrical insulator. The concave base housing 506 may be supported on a frame 508. An LED 510 may be placed in the concave base housing 506. The frame 508 may be integrated with the cathode 504, and may be fabricated, for example, from lead or another material as earlier discussed. The LED 510 may include a p-doped semiconductor body 512 and an n-doped semiconductor body 514. As an example, more than one LED 510 may be placed in the concave base housing.

The p-doped semiconductor body 512 may be in signal communication with a base conductor 516 and the n-doped semiconductor body 514 may be in signal communication with a top conductor 518. The base conductor 516 and top conductor 518 may allow current to flow in and out of the p-doped semiconductor body 512 and n-doped semiconductor body 514, respectively. A cathode bonding wire 520 may electrically connect the cathode 504 to the base conductor 516 placing the cathode 504 in signal communication with the base conductor 516. Similarly, an anode bonding wire 522 may electrically connect the anode 502 to the top conductor 518. As an alternative example, the concave base housing 506 may be formed of an electrical conductor, and the base conductor 516 and the cathode bonding wire 520 may be omitted. As an example, more than one cathode bonding wire 520, more than one anode bonding wire 522, or more than one of each of such bonding wires may be utilized.

It is appreciated that in an alternative example structure for the LED Device with Flexible Containment for Liquid Encapsulant, the semiconductor body 514 may be p-doped and the semiconductor body 512 may be n-doped. A current flow through the LED 510 in such an alternative structure may be reversed, so that the LED Device with Flexible Containment for Liquid Encapsulant 500 may include an anode 504 and a cathode 502. As another example, the cathode 504 may be replaced by a first terminal 504 at a relatively high electrical potential in signal communication with the p-doped semiconductor body 512; and the anode 502 may be replaced by a second terminal 502 at a relatively low electrical potential in signal communication with the n-doped semiconductor body 514.

As an example, the LED 510 may be immersed in a liquid encapsulant composition that is contained in a liquid containment chamber 524. The liquid containment chamber 524 may include and be in fluid communication with grooves 526 and 528 that may each provide a defined expansion volume for the liquid encapsulant composition. The term "groove" as used throughout this specification broadly means and includes any shape, configuration, location, or size of a space supplementing otherwise generally regular dimensions of an interior defined by the concave base housing 506, the groove being configured to provide expansion room for a liquid encapsulant in the liquid containment chamber 524. Movement of liquid encapsulant into and out of the grooves 526 and 528 may occur as the liquid encapsulant expands and contracts during heating and cooling cycles in operation of the LED device 500. Further grooves similar to grooves 526 and 528 may be arranged around the central axis of the LED device 500, the central axis being indicated by the arrow 530. These grooves may be located at any selected point along the side inner wall 532 or base inner wall 534 of the LED device 500. As the liquid encapsulant composition in the liquid containment chamber 524 expands and contracts, excess liquid encapsulant may flow into and out of the grooves 526 and 528. The liquid encapsulant composition may generally be any liquid composition having good optical properties, as discussed earlier. The grooves 526 and 528 may, as an example, contain a porous material configured to reversibly absorb the liquid encapsulant composition.

The side inner wall 532 and base inner wall 534 of the concave base housing 506 may form a reflector for the photons emitted by the LED 510, and may deflect photons generally in the direction 530 of maximum photonic radiation of the LED Device with Flexible Containment for Liquid Encapsulant 500. The base inner wall 534 may have a circular circumference. The anode 502 and cathode 504 of the LED Device with Flexible Containment for Liquid Encapsulant 500 may be supported on a base 536, and may be collectively encapsulated in a lens 538 forming an interface 540 with the liquid containment chamber 524. The lens 538 may be a diffused lens as an example, and may have a domed surface 542 forming a substantially convex lens for example photonic emissions 544, 546, 548 and 550 from the LED Device with Flexible Containment for Liquid Encapsulant 500. As an alternative example, the lens 538 may not be a diffused lens.

In an example of operation, a bias current may be applied across the anode 502 and cathode 504 by an external power source, not shown. The bias current may induce charge carriers to be transported across the interface 552 between the n-doped semiconductor body 514 and the p-doped semiconductor body 512. Electrons flow from the n-doped semiconductor body 514 to the p-doped semiconductor body 512, and holes are generated in the opposite direction. Electrons injected into the p-doped semiconductor body 512 recombine with the holes, resulting in electroluminescent emission of photons from the LED 510.

Figure 6:
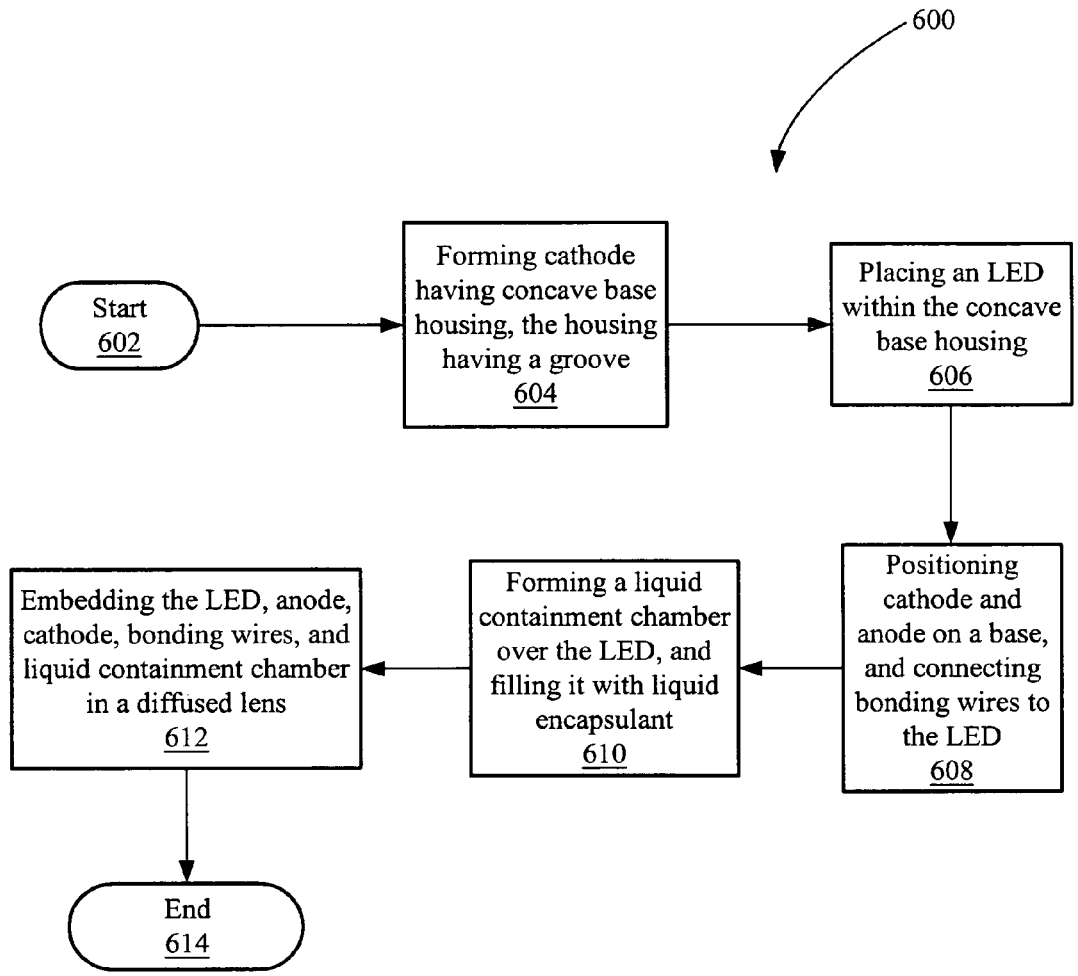
FIG. 6 is a flowchart showing an example of a method for fabricating the LED Device with Flexible Containment for Liquid Encapsulant shown in FIG. 5.

FIG. 6 is a flowchart 600 showing an example of a process for fabricating the LED Device with Flexible Containment for Liquid Encapsulant 500 shown in FIG. 5. The process begins in step 602, and in step 604, a cathode 504 having a concave base housing 506 may be formed, in which the concave base housing 506 may be supported by a frame 508 and may have photon-reflective side inner wall 532 and base inner wall 534. The concave base housing 506 may be formed with grooves 526 and 528 configured to provide a defined expansion volume for a liquid encapsulant composition.

An LED 510 may be placed in the concave base housing 506 on the base inner wall 534, in step 606. The LED 510 may be pre-made, or formed in situ. The LED 510 may be positioned at a point on the base inner wall 534 substantially equidistant from all points at which base inner wall 534 meets side inner wall 532. The LED 510 may be fabricated as described above in the discussion of FIG. 2. In step 608, the cathode 504 and an anode 502 may be positioned on a base 536, and bonding wires 520 and 522 may be connected to the conductors 516 and 518 and to the cathode 504 and anode 502, respectively.

In step 610, an upper wall defining a liquid containment chamber 524 may be formed at the interface 540, the liquid containment chamber being in communication and integral with the grooves 526 and 528. The liquid containment chamber 524 may be filled with a suitable liquid encapsulant composition.

In step 612, the LED 510, anode 502, cathode 504, bonding wires 520 and 522, and liquid containment chamber 524 may be embedded in a diffused lens 538. The process then ends in step 614. The diffused lens may be fabricated as discussed above in connection with FIG. 2. It is appreciated that the order of steps in the process 600 may be changed. As an example, either all or a portion of step 608 may be performed later in the process without departing from the method.

Figure 7:
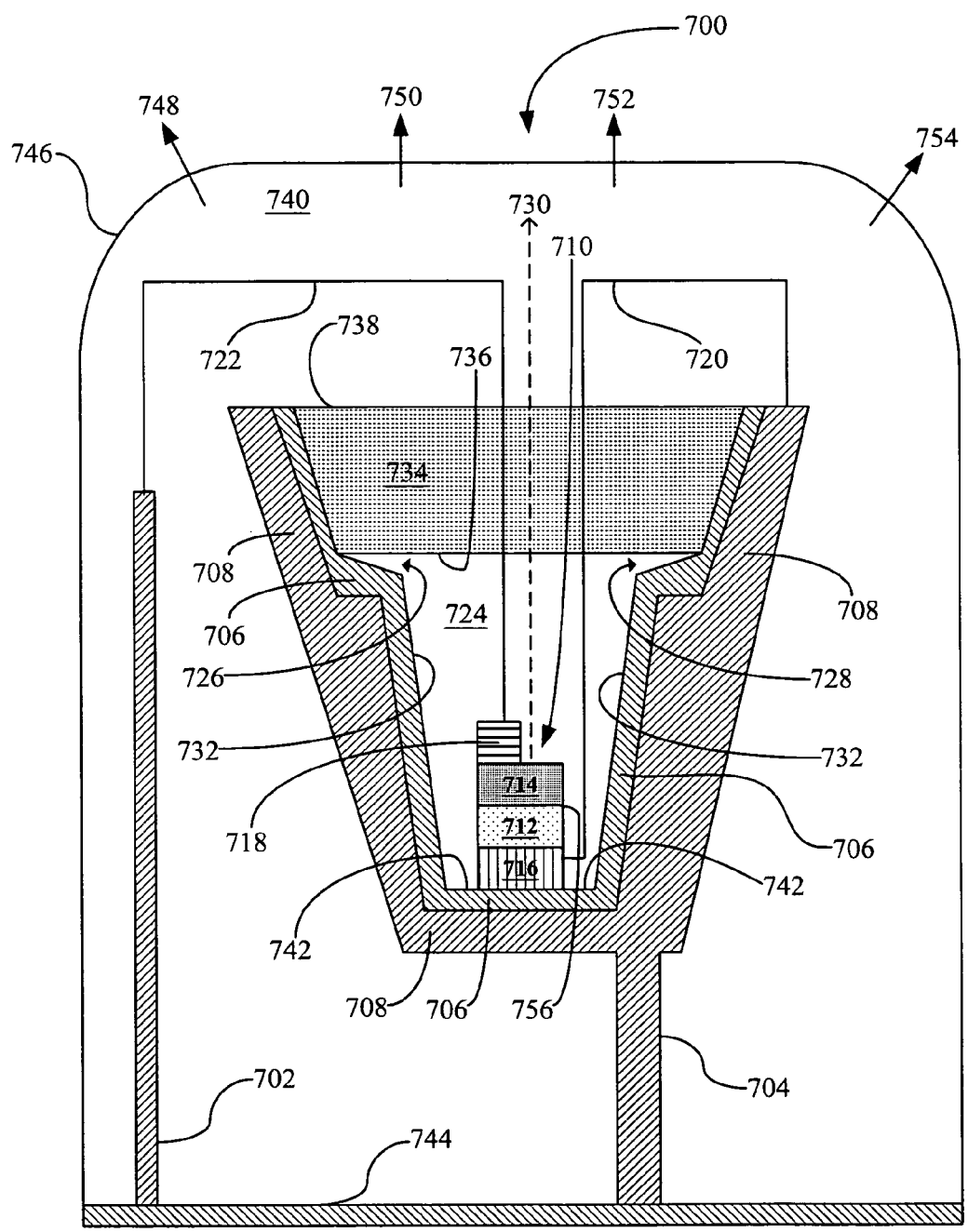
FIG. 7 is a cross-sectional view showing an example of yet another LED Device with Flexible Containment for Liquid Encapsulant.

FIG. 7 is a cross-sectional view showing an example of another LED Device with Flexible Containment for Liquid Encapsulant 700. The LED Device with Flexible Containment for Liquid Encapsulant 700 may include an anode 702, and a cathode 704. The cathode 704 may include a concave base housing 706 formed of an electrical insulator. The concave base housing 706 may be supported on a frame 708. An LED 710 may be placed in the concave base housing 706. The frame 708 may be integrated with the cathode 704, and may be fabricated, for example, from lead or another material as earlier discussed. The LED 710 may include a p-doped semiconductor body 712 and an n-doped semiconductor body 714. As an example, more than one LED 710 may be placed in the concave base housing.

The p-doped semiconductor body 712 may be in signal communication with a base conductor 716 and the n-doped semiconductor body 714 may be in signal communication with a top conductor 718. The base conductor 716 and top conductor 718 may allow current to flow in and out of the p-doped semiconductor body 712 and n-doped semiconductor body 714, respectively. A cathode bonding wire 720 may electrically connect the cathode 704 to the base conductor 716 placing the cathode 704 in signal communication with the base conductor 716. Similarly, an anode bonding wire 722 may electrically connect the anode 702 to the top conductor 718. As an alternative example, the concave base housing 706 may be formed of an electrical conductor, and the base conductor 716 and the cathode bonding wire 720 may be omitted. As an example, more than one cathode bonding wire 720, more than one anode bonding wire 722, or more than one of each of such bonding wires may be utilized.

It is appreciated that in an alternative example structure for the LED Device with Flexible Containment for Liquid Encapsulant 700, the semiconductor body 714 may be p-doped and the semiconductor body 712 may be n-doped. A current flow through the LED 710 in such an alternative structure may be reversed, so that the LED Device with Flexible Containment for Liquid Encapsulant 700 may include an anode 704 and a cathode 702. As another example, the cathode 704 may be replaced by a first terminal 704 at a relatively high electrical potential in signal communication with the p-doped semiconductor body 712; and the anode 702 may be replaced by a second terminal 702 at a relatively low electrical potential in signal communication with the n-doped semiconductor body 714.

As an example, the LED 710 may be immersed in a liquid encapsulant composition that is contained in a liquid containment chamber 724. The liquid containment chamber 724 may include and may be in fluid communication with grooves 726 and 728 that may each provide a defined expansion volume for the liquid encapsulant composition. Movement of liquid encapsulant into and out of the grooves 726 and 728 may occur as the liquid encapsulant expands and contracts during heating and cooling cycles in operation of the LED device 700. Further grooves similar to grooves 726 and 728 may be arranged around the central axis of the LED device 700, the central axis being indicated by the arrow 730. These grooves may be located at any selected point along the side inner wall 732 of the LED device 700. It is appreciated that the example cross-sectional shapes of the grooves 726 and 728 and the example vertical locations of the grooves formed in the concave base housing 706 along the central axis, the axis being indicated by the arrow 730, may be varied. As the liquid encapsulant composition in the liquid containment chamber 724 expands and contracts, excess liquid encapsulant may flow into and out of the grooves 726 and 728. The liquid encapsulant composition may generally be any liquid composition having good optical properties, as discussed earlier. The grooves 726 and 728 may, as an example, contain a porous material configured to reversibly absorb the liquid encapsulant composition.

As an example, the LED Device with Flexible Containment for Liquid Encapsulant 700 may be a phosphor-converting LED device having a phosphor element 734 including a selected phosphor. The selected phosphor may be dispersed in a suitable encapsulant in a liquid phase and then deposited onto an upper wall of the liquid containment chamber 724 to form the phosphor element 734. The phosphor element may then form an interface 736 with the liquid containment chamber 724, and an interface 738 with a diffused lens 740.

The side inner wall 732 and base inner wall 742 of the concave base housing 706 may form a reflector for photons emitted by the LED 710, and may deflect photons generally in the direction of the arrow 730 of maximum photonic radiation of the LED Device with Flexible Containment for Liquid Encapsulant 700. The base inner wall 742 may have a circular circumference. The anode 702 and cathode 704 may be supported on a base 744, and may be collectively encapsulated in the lens 740 forming the interface 738 with the phosphor element 734. The lens 740 may be a diffused lens as an example. The lens 740 may have a domed surface 746 forming a substantially convex lens for example photonic emissions 748, 750, 752 and 754 from the LED Device with Flexible Containment for Liquid Encapsulant 700. As an alternative example, the lens 740 may not be a diffused lens.

In an example of operation, a bias current may be applied across the anode 702 and cathode 704 by an external power source, not shown. The bias current may induce charge carriers to be transported across the interface 756 between the n-doped semiconductor body 714 and the p-doped semiconductor body 712. Electrons flow from the n-doped semiconductor body 714 to the p-doped semiconductor body 712, and holes are generated in the opposite direction. Electrons injected into the p-doped semiconductor body 712 recombine with the holes, resulting in electroluminescent emission of photons from the LED 710.

Figure 8:
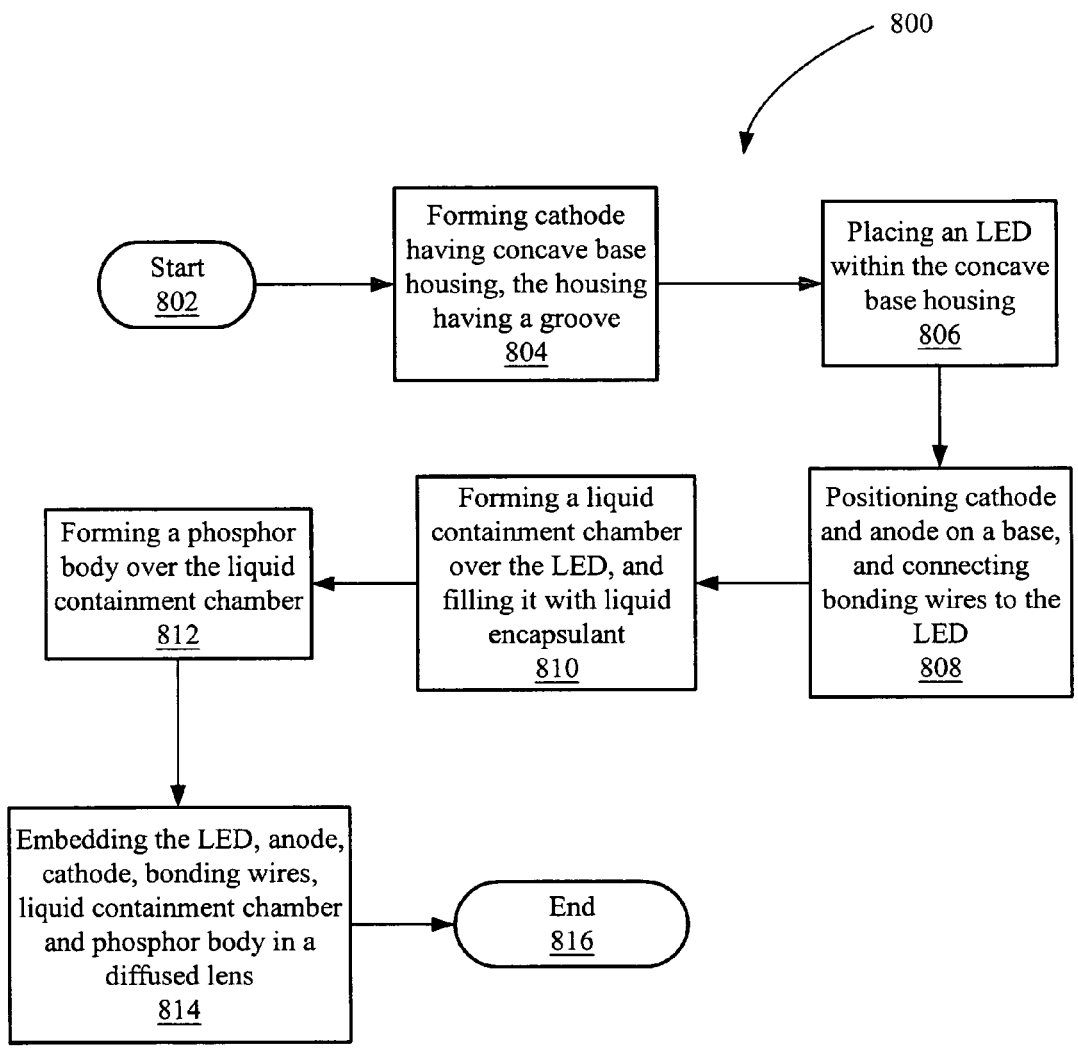
FIG. 8 is a flowchart showing an example of a method for fabricating the LED Device with Flexible Containment for Liquid Encapsulant shown in FIG. 7.

FIG. 8 is a flowchart 800 showing an example of a process for fabricating the LED Device with Flexible Containment for Liquid Encapsulant 700 shown in FIG. 7. The process begins in step 802, and in step 804, a cathode 704 having a concave base housing 706 may be formed. The concave base housing 706 may be supported by a frame 708 and may have photon-reflective side inner wall 732 and base inner wall 742. The concave base housing 706 may be formed with grooves 726 and 728 configured to provide a defined expansion volume for a liquid encapsulant composition.

An LED 710 may be placed in the concave base housing 706 on the base inner wall 742, in step 806. The LED 710 may be pre-made, or formed in situ. The LED 710 may be positioned at a point on the base inner wall 742 substantially equidistant from all points at which base inner wall 742 meets side inner wall 732. The LED 710 may be fabricated as described above in the discussion of FIG. 2. In step 808, the cathode 704 and an anode 702 may be positioned on a base 744, and bonding wires 720 and 722 may be connected to the conductors 716 and 718 and to the cathode 704 and anode 702, respectively.

In step 810, an upper wall defining a liquid containment chamber 724 may be formed at the interface 736, the liquid containment chamber being in communication and integral with the grooves 726 and 728. The liquid containment chamber 724 may be filled with a suitable liquid encapsulant composition. In step 812, a phosphor-encapsulant composition may be formulated as discussed above, and a phosphor body 734 may be formed in the concave base housing 706 interfaced with the upper wall of the liquid containment chamber 724. As an example, the phosphor body 734 may be molded or cast into the selected shape.

In step 814, the LED 710, anode 702, cathode 704, bonding wires 720 and 722, liquid containment chamber 724, and phosphor body 734 may be embedded in a diffused lens 740. The process then ends in step 816. The diffused lens may be fabricated as discussed above in connection with FIG. 2. It is appreciated that the order of steps in the process 800 may be changed. As an example, either all or a portion of step 808 may be performed later in the process without departing from the method.

While the foregoing description refers to conduits and grooves configured to provide flexible containment of a liquid encapsulant composition in an LED device, it is appreciated that the subject matter is not limited to the structures shown in the figures. Other shapes, configurations, numbers, and positions of conduits and grooves configured to provide such flexible containment are included. Although some examples use an LED emitting blue photons to stimulate luminescent emissions from a yellow phosphor in order to produce output light having a white appearance, the subject matter also is not limited to such a device. Any LED device that may benefit from the functionality provided by the LED device structures described above may be implemented as an LED Device with Flexible Containment for Liquid Encapsulants as disclosed herein and shown in the drawings.

Moreover, it will be understood that the foregoing description of numerous implementations has been presented for purposes of illustration and description. This description is not exhaustive and does not limit the claimed invention to the precise forms disclosed. Modifications and variations are possible in light of the above description or may be acquired from practicing the invention. The claims and their equivalents define the scope of the invention.

What is claimed:

1. An LED Device with Containment for a Liquid Encapsulant, comprising:
    a concave base housing;
    a light emitting diode ("LED") in the concave base housing, the LED having a p-doped semiconductor body and an n-doped semiconductor body;
    a liquid containment chamber over the LED, configured to contain liquid encapsulant; and
    a reservoir located within the chamber, the reservoir permitting expansion and contraction of the liquid encapsulant.

2. The LED Device with Containment for a Liquid Encapsulant of claim 1, wherein the reservoir comprises a groove.

3. The LED Device with Containment for a Liquid Encapsulant of claim 2, wherein the groove is positioned so that gravity induces liquid encapsulant to flow out of the groove.

4. The LED Device with Containment for a Liquid Encapsulant of claim 1, further including a phosphor body over the liquid containment chamber.

5. The LED Device with Containment for a Liquid Encapsulant of claim 4, wherein the phosphor body includes a phosphor and an encapsulant.

6. The LED Device with Containment for a Liquid Encapsulant of claim 4, wherein the LED has an emission maximum within a range of about 420 nanometers to about 490 nanometers, the n-doped semiconductor body and the p-doped semiconductor body each include a member selected from the group consisting of gallium nitride, indium-gallium-nitride, gallium-aluminum-indium-nitride, and mixtures, the phosphor has an emission maximum within a range of about 550 nanometers to about 585 nanometers, the phosphor includes a cerium-doped yttrium-aluminum garnet, the phosphor includes at least one element selected from the group consisting of yttrium, lutetium, selenium, lanthanum, gadolinium, samarium and terbium, and the phosphor includes at least one element selected from the group consisting of aluminum, gallium and indium.

7. The LED Device with Containment for Liquid Encapsulant of claim 1, further including a first terminal at a relatively high electrical potential in signal communication with the p-doped semiconductor body, and a second terminal at a relatively low electrical potential in signal communication with the n-doped semiconductor body.

8. The LED Device with Containment for Liquid Encapsulant of claim 1, wherein the space includes a porous material configured to reversibly absorb liquid encapsulant.

9. A method for fabricating an LED Device with Containment for Liquid Encapsulant, the method comprising:
    forming a concave base housing;
    placing a light emitting diode ("LED") in the concave base housing, the LED having a p-doped semiconductor body and an n-doped semiconductor body;
    forming a liquid containment chamber over the LED, configured to contain liquid encapsulant; and
    forming a reservoir within the chamber, the reservoir permitting expansion and contraction of the liquid encapsulant.

10. The method of claim 9, wherein the reservoir is a groove configured to contain the liquid encapsulant.

11. The method of claim 10, further including positioning a groove so that gravity induces liquid encapsulant to flow out of the groove.

12. The method of claim 9, further including forming a phosphor body over the liquid containment chamber.

13. The method of claim 9, further including placing a porous material in the reservoir.

* * * * *